United States Patent [19]

Yoshino

[11] Patent Number: 5,073,512

[45] Date of Patent: Dec. 17, 1991

[54] METHOD OF MANUFACTURING INSULATED GATE FIELD EFFECT TRANSISTOR HAVING A HIGH IMPURITY DENSITY REGION BENEATH THE CHANNEL REGION

[75] Inventor: Akira Yoshino, Tokyo, Japan

[73] Assignee: NEC Corporation, Tokyo, Japan

[21] Appl. No.: 512,291

[22] Filed: Apr. 20, 1990

[30] Foreign Application Priority Data

Apr. 21, 1989 [JP] Japan .................................. 1-102452
Jun. 23, 1989 [JP] Japan .................................. 1-161691

[51] Int. Cl.$^5$ ......................................... H01L 21/266
[52] U.S. Cl. ...................................... 437/41; 437/45;
    437/150; 437/931; 148/DIG. 26
[58] Field of Search ..................... 437/29, 40, 41, 45,
    437/27, 28, 150, 187; 148/DIG. 53, DIG. 26

[56] References Cited

U.S. PATENT DOCUMENTS

| | | | |
|---|---|---|---|
| 4,145,233 | 3/1979 | Sefick et al. | 437/41 |
| 4,514,893 | 5/1985 | Kinsbron | 437/45 |
| 4,895,520 | 1/1990 | Berg | 437/29 |

FOREIGN PATENT DOCUMENTS 0274622 11/1987 Japan .................................. 437/187

OTHER PUBLICATIONS

Wolf, S., Silicon Processing for the VLSI Era, pp. 384–387, 1986.

Primary Examiner—Brian E. Hearn
Assistant Examiner—C. Chaudhari
Attorney, Agent, or Firm—Sughrue, Mion, Zinn, Macpeak & Seas

[57] ABSTRACT

On a semiconductor substrate, a thin insulating film to be used as a gate insulating film, a thin polysilicon film and a thick mask layer are formed in the order and an opening for gate electrode formation is formed in the mask layer. After an ion implantation of impurities having the same conductivity type as that of the substrate is performed thereto through the opening to form, in the substrate, an impurity region having the same conductivity type as and impurity density larger than that of the substrate, the opening is filled with electrically conductive material. Thereafter, the mask layer is removed and an exposed first polysilicon film is removed to form a gate electrode comprising the conductive material and an underlying portion of the polysilicon film. Then, source region and drain region are formed in self-aligned manner with respect to the gate electrode.

6 Claims, 8 Drawing Sheets

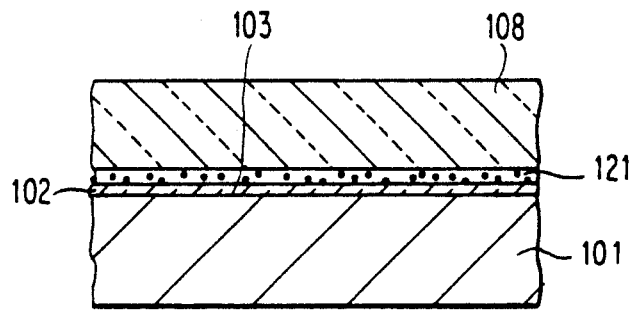
FIG. 5A
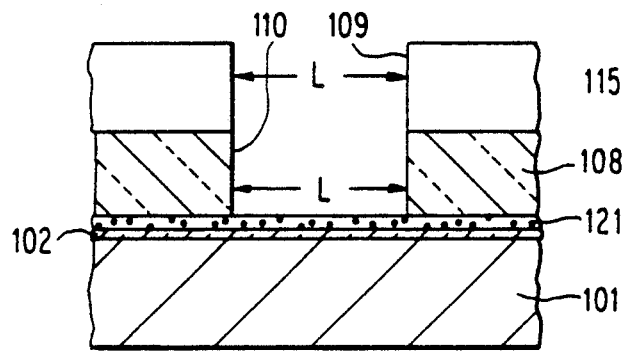
FIG. 5B
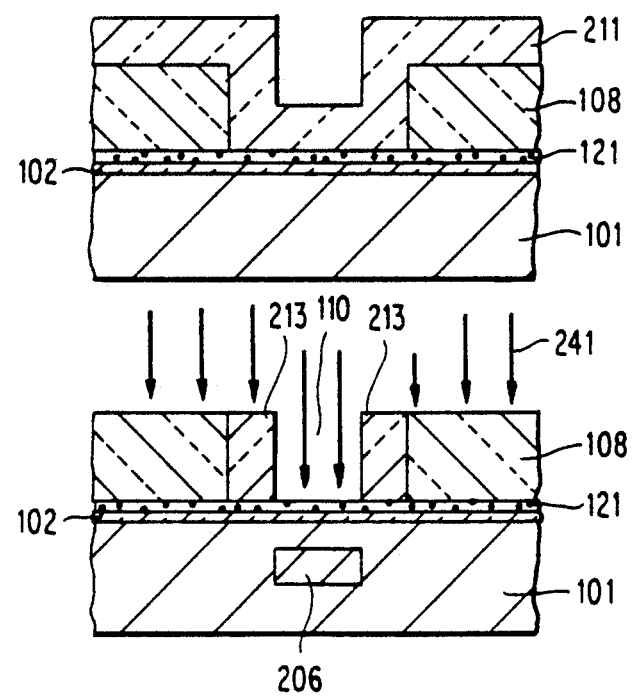
FIG. 5C
FIG. 5D

METHOD OF MANUFACTURING INSULATED GATE FIELD EFFECT TRANSISTOR HAVING A HIGH IMPURITY DENSITY REGION BENEATH THE CHANNEL REGION

BACKGROUND OF THE INVENTION:

1. Field of the Invention

The present invention relates to a method of manufacturing an insulated gate field effect transistor (hereinafter abbreviated as "IGFET") and, particularly, to a method of manufacturing a miniaturized IGFET operable at high speed.

2. Description of Related Art

An example of a conventional fabrication method of IGFET, particularly, of a gate electrode thereof, is illustrated in FIGS. 1A to 1D.

In FIG. 1A, a thermally-oxidized silicon oxide film 12 is formed on a silicon substrate 11, on which a polycrystalline silicon (hereinafter abbreviated as "polysilicon") film 13 is formed as gate electrode material. On the polysilicon film 13, a positive photoresist 14 is formed. Then, as shown in FIG. 1B, the photoresist 14 is patterned correspondingly to a pattern of a gate electrode to be formed. Thereafter, the polysilicon film 13 is etched away using the patterned photoresist 14 as a mask to form a gate electrode 23 as shown in FIG. 1C. Then, the photoresist 14 is removed. Thereafter, as shown in FIG. 1D, impurities of opposite conductivity type to that of the silicon substrate 11 are implanted by an ion-implantation method into the substrate 11 using the gate electrode 23 as a mask to form source and drain regions 15 and 16 of the opposite conductivity type in self-aligned manner with respect to the gate electrode 23.

On the other hand, an IGFET is known in which, in order to prevent undesired punch-through phenomenon between the source region 15 and the drain region 16, an impurity region having the same conductivity type as the substrate with higher density is formed between the source and drain regions. Such IGFET can be fabricated, with the same gate electrode formation shown in FIG. 1, by the steps shown in FIGS. 2A to 2D.

First, as shown in FIG. 2A, after a gate silicon oxide film 12 is formed on a major surface of an N type single crystal silicon substrate 11 by using a thermal oxidation technique, N type impurities (e.g. phosphorus) 41 are implanted thereto by an ion implantation technique to form an N type impurity region 31 of relatively high impurity density. Thereafter, in order to control an inversion threshold voltage of the IGFET to a predetermined value, P type impurities (e.g. boron) 42 are implanted to convert a region between the N type impurity region 31 and the gate oxide film 12 into a P type, for example, impurity region 32 of a suitable net impurity density. Then, as shown in FIG. 2B, a polysilicon film 13 is deposited on the gate silicon oxide film 12 through a chemical vapour deposition (hereinafter abbreviated as "CVD") method and, then, is doped with phosphorus by diffusion to increase conductivity of this film. Then, a photoresist pattern 14 is formed thereon. Then, as shown in FIG. 2C, the polysilicon film 13 is etched using the photoresist pattern 14 as a mask, resulting in a gate electrode 23 of a predetermined size. Thereafter, as shown in FIG. 2D, the substrate is ion-implanted with P type impurities (e.g. boron) 45 using the gate electrode 23 as a mask to form a P type high impurity density region as source and drain regions 15 and 16 in a self-aligned manner with respect to the gate electrode 23.

In the conventional method of manufacturing the IGFET mentioned above, however, the relatively high impurity density region 31 formed in the semiconductor substrate 11 for restriction of punch-through phenomenon exists throughout a region in which the transistor is formed and a junction is formed between this region and a whole bottom area of the source region 15 and the drain region 16 which are of high impurity density. Therefore, junction capacitance is increased, resulting in lowering switching speed of the transistor.

SUMMARY OF THE INVENTION

A primary object of the present invention is to provide a method of manufacturing an IGFET, by which the above mentioned high impurity density region can be substantially defined beneath a channel region between a source region and a drain region.

The present invention provides a method of manufacturing an IGFET, comprising the steps of forming a thin insulating film on a major surface of a semiconductor substrate having a first conductivity type, the thin insulating film being used to form a gate insulating film; forming a thin first polysilicon film on the insulating film; forming a mask layer on the first polysilicon film and forming an opening in the mask layer; ion-implanting the substrate with impurities of the first conductivity type through the insulating film to form a first impurity region of high impurity density in the substrate beneath the opening using the mask layer as a mask; forming continuously a conductive film within the opening so as to fill the opening and on an upper surface of the mask layer; removing the conductive film except a portion thereof within the opening to expose the upper surface of the mask layer; removing the mask layer; etching away selectively the first polysilicon film except a portion thereof beneath the conductive film pattern having a configuration determined by the opening to form a gate electrode by the remaining portion with the conductive film pattern; and implanting impurities of a second conductivity type opposite to the first conductivity type in the semiconductor substrate using the gate electrode as a mask to form source and drain regions of the second conductivity type in the semiconductor substrate.

According to the present invention, the first impurity region of high impurity density which is effective to prevent punch-through phenomenon is formed by ion-implantation through the opening formed in the mask layer which may be an insulating layer such as a silicon oxide layer deposited by a CVD method or a sputtering method, and the gate electrode is formed by the opening. That is, the configuration of the gate electrode and hence the first impurity region formed under the gate electrode for prevention of punch-through is determined by the configuration of the opening in the mask layer, and the source and drain regions are defined outside the high impurity region. Since the first high impurity density region and the source and drain regions adjacent thereto can be formed in self-aligned manner, controllability of size of overlapping portion thereof is improved. Further, since a junction can be formed between the first high impurity region and only lower portions of side surfaces of the source and drain regions, it is possible to minimize the junction capacitance. Therefore, according to the present invention, it is possible to fabricate an IC having an improved operating speed through simplified steps. Further, since the thin first polysilicon film operating as a lower portion of the gate electrode is provided on the whole surface of the substrate till the selective etching thereof, the removal of the entire mask layer of, for example, a CVD silicon oxide film can be performed by wet-etching. Further, by optimizing the thickness of the thin first polysilicon film, damage of the gate oxide film during a reactive ion-etching to form the opening in the mask layer is reduced, resulting in an improved reliability. In general, the conductive film which occupies major part of the gate electrode is a thick second polysilicon film. However, the conductive film may be made of a high melting point metal selected from a group of tungsten, molybdenum, platinum, titanium and tantalum and/or a silicide of such metal. Further, it is possible to form a second impurity region for controlling a threshold voltage of the IGFET and determining the voltage, in the channel region between, in the horizontal direction, source and drain regions and between, in the vertical direction, the first high impurity region and the surface of the substrate by ion-implantation of impurities of the second conductivity through the opening of the mask layer. The second impurity region may be a region of the first conductivity type, that is, the same conductivity type as that of the substrate and of a net impurity density lower than that of the substrate. Alternatively, it may be a region of the second conductivity type, that is, the opposite conductivity to that of the substrate and of a net impurity density lower than that of the substrate. When the first impurity region is to be located below the center portion of a channel region in the channel length direction between the source region and the drain region, side walls are formed on both of side faces in the channel length direction of the opening portion of the mask layer by means of the known anisotropic reactive etching technique in which etching in a direction perpendicular to the major surface of the substrate is predominant, and then the first impurity region is formed by ion implantation through the opening. In such case, after the side walls of the opening are removed, a second impurity region is formed by ion implantation, if necessary, and the gate electrode is formed in the opening. Alternatively, when a gate electrode has a width (length in source-drain direction; channel length direction) narrower than that of the opening of the mask layer, that is, when an opening is formed by lithographic technique as small as possible and a gate electrode which is smaller than the opening to form a shorter channel length, is to be formed, the conductive film for gate electrode formation is deposited with the side walls being deposited and then it is etched away from the top so that an upper surface of the mask layer is exposed with the conductive film being on the side walls within the opening. Thereafter, by removing the mask layer and the side walls and patterning the first polysilicon film as mentioned above, it is possible to obtain an IGFET whose gate electrode is smaller than realizable with lithographic technique, that is, having a smaller channel length.

BRIEF DESCRIPTION OF THE DRAWINGS

FIGS. 2A to 2D are cross-sectional views showing sequentially process steps in another conventional method for manufacturing an IGFET having a high impurity concentration region for prevention of punch-through;

FIGS. 5A to 5I are cross-sectional views showing sequentially process steps in a third embodiment of the present invention.

DETAILED DESCRIPTION OF THE PREFERRED EMBODIMENTS

FIGS. 3A to 3H are cross sections of a semiconductor chip in respective fabrication steps according to a first embodiment of the present invention.

Figure 1A:
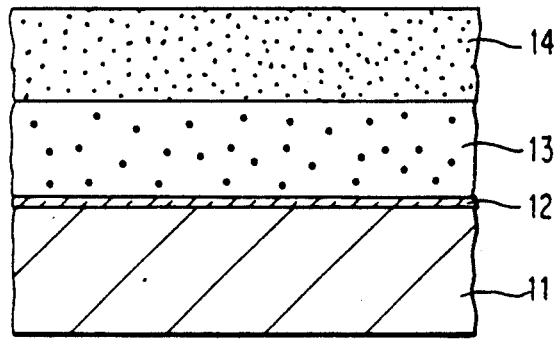
FIGS. 1A to 1D are cross-sectional views showing sequentially process steps in one conventional method for manufacturing an IGFET.
Figure 1B:
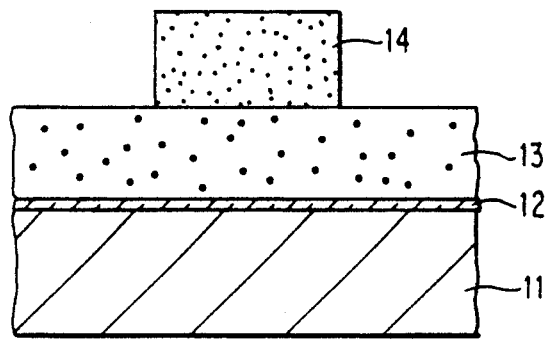
Figure 1C:
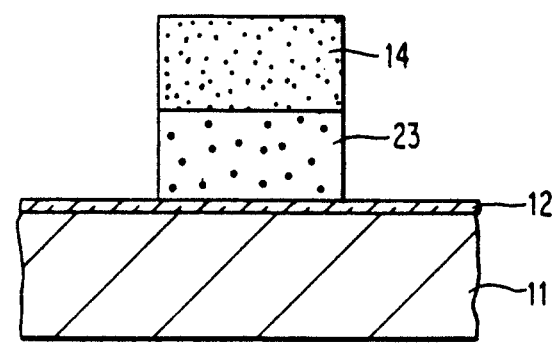
Figure 1D:
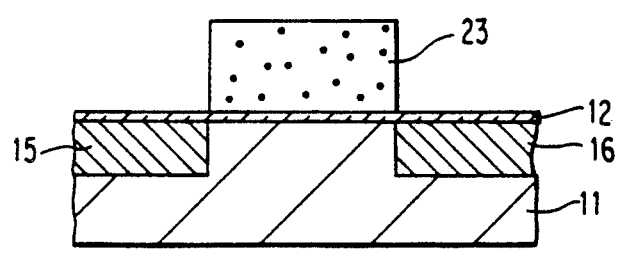
Figure 2A:
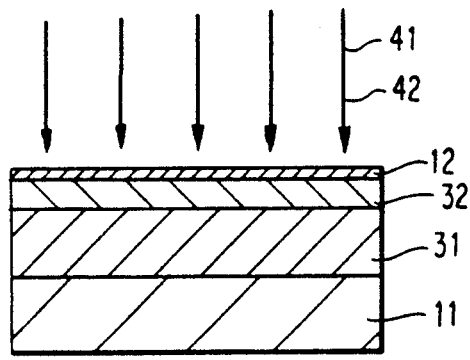
Figure 2B:
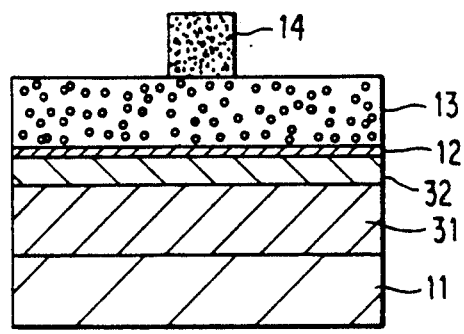
Figure 2C:
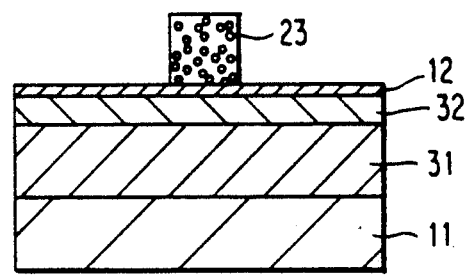
Figure 2D:
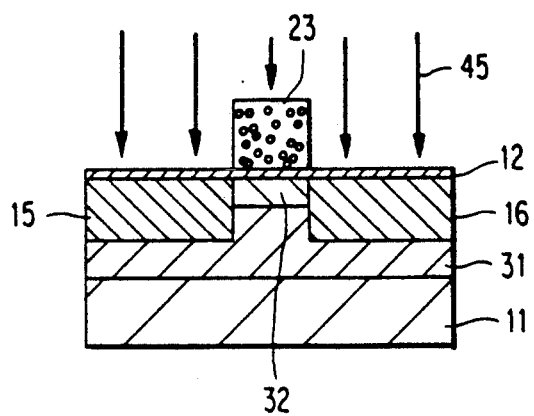
Figure 3A:
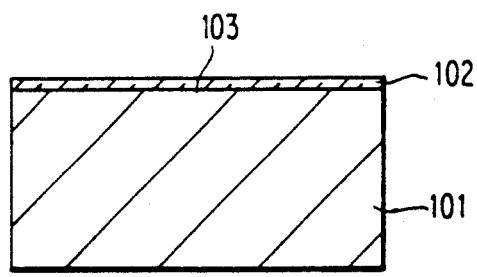
FIGS. 3A to 3H are cross-sectional views showing sequentially process steps in a first embodiment of the present invention.
Figure 3B:
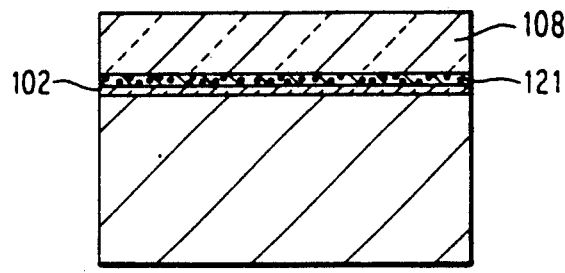
Figure 3C:
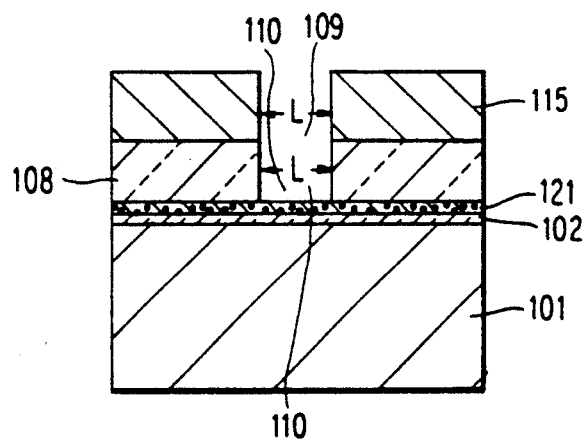
Figure 3D:
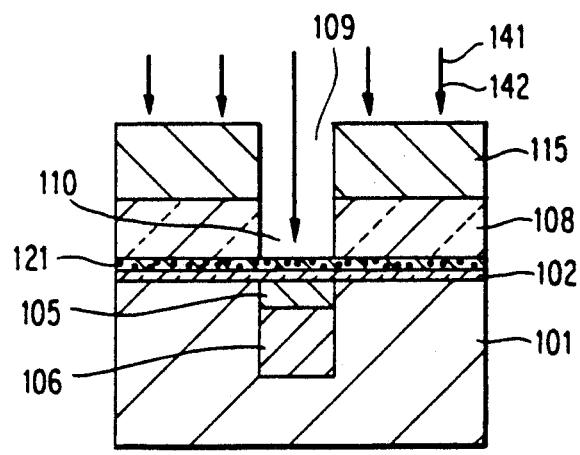
Figure 3E:
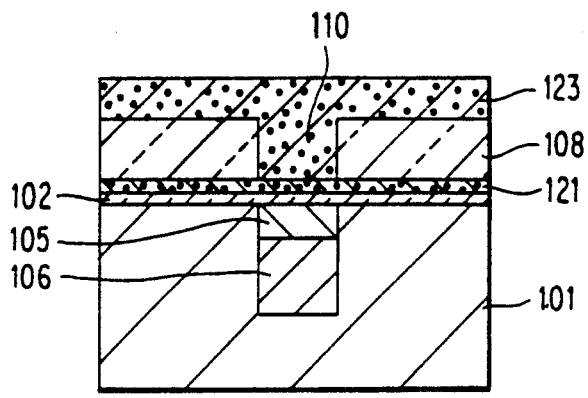
Figure 3F:
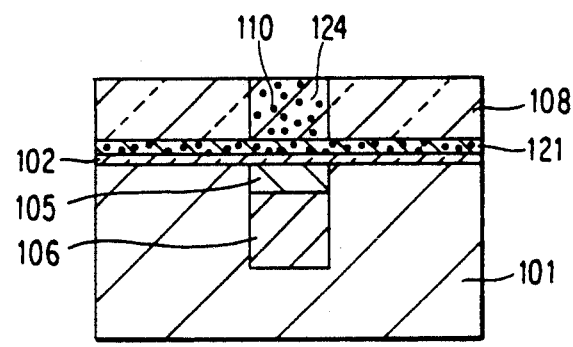
Figure 3G:
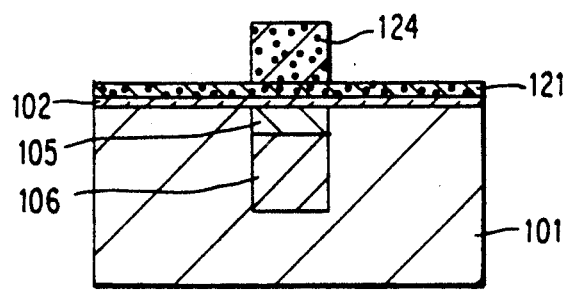
Figure 3H:
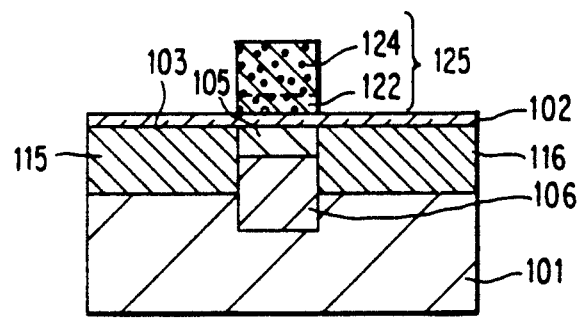

A silicon oxide film 102, which is used as a gate insulating film under a gate electrode, having thickness of about 15 nm (nano meters) is thermally formed on a major surface 103 of an N type single crystal silicon substrate 101 containing phosphorus in the order of $1 \times 10^{16}$ cm$^{-3}$ as impurity (FIG. 3A). On the silicon oxide film 102, a first polysilicon film 121 having a thickness of about 50 nm is deposited by a CVD method and, then, a thick silicon oxide layer 108 having a thickness of about 0.5 μm is formed by a CVD method or a sputtering method as a mask layer on the first polysilicon film 121 (FIG. 3B). On the silicon oxide layer 108, a photoresist film pattern 115 having an aperture 109 of 1.0 μm length L, and an opening 110 having the length L of 1.0 μm is formed in the CVD silicon oxide layer 108 just under the aperture 109 by a reactive ion etching method using the photoresist film pattern 115 as a mask (FIG. 3C). The opening 110 is positioned where the gate electrode of the IGFET is to be formed. Next, an ion implantation of phosphorus 141 and an ion implantation of boron 142 are performed to form an N-type impurity region 106 and a P-type impurity region 105, respectively, in the silicon substrate 101 under the opening 110. The former phosphorus ion implantation is conducted at energy of 150 KeV and dosage density of $5 \times 10^{12}$ P+/cm$^2$ through the thin polysilicon film 121 and the thin silicon oxide film 102 using the CVD silicon oxide layer 108 and the photoresist film 115 as a mask, and the latter boron ion implantation is conducted at energy of 15 KeV and dosage density of $3 \times 10^{12}$ B+/cm$^2$ through the films 121, 102 using the layer 108 and the film 115 as a mask. After the photoresist film pattern 115 is completely removed, a thick second polysilicon film 123 of about 1.0 μm thickness is deposited by a CVD method on the silicon oxide layer 108 and within the opening 110 so as to fill the opening (FIG. 3E). The second polysilicon film 123 is doped with by means of diffusion to increase the conductivity thereof and then unnecessary portion of the second polysilicon film 123 is removed by anisotropic reactive ion etching until an upper surface of the CVD silicon oxide layer 108 is exposed, leaving within the opening 110 to form an upper gate electrode portion 124 which occupies major part of gate electrode thickness (FIG. 3F). Then, the CVD silicon oxide layer 108 is completely removed by dilute hydrogen fluoride (FIG. 3G). Then, a whole exposed part of the first polysilicon film 121 is completely removed by a reactive anisotropic ion etching method, so that a gate electrode 125 is formed by the upper gate electrode portion 124 of the second polysilicon film 123 and the remaining portion 122 of the first polysilicon film 121 under the portion 124. Since the removal of the exposed first polysilicon film having thickness of 50 nm is performed without using mask, an upper surface portion of the second polysilicon film having thickness of 0.5 μm may be cut away by about several tens nm. However, such small amount of removal of the second polysilicon film may be neglected. Thereafter, ion-implantation of boron followed by a thermal activation is performed at implantation energy of, for example, 70 KeV and dosage density of $5 \times 10^{15}$ cm$^{-2}$ using the gate electrode 125 as a mask to form P type high impurity density regions of source and drain regions 115, 116 (FIG. 3H).

The IGFET fabricated in this manner comprises the N type single crystal silicon substrate 101 containing phosphorus in the order of $1 \times 10^{16}$/cm$^3$ as impurity, the gate oxide film 102 having thickness of about 15 nm formed on the major surface 103 of the substrate 101 and the gate electrode 125 of polysilicon having thickness of about 0.4 μm, gate length of about 1 μm and sheet resistance of about 20 Ω/□. The P type high impurity density regions 115 and 116 containing boron of about $1 \times 10^{20}$/cm$^3$ as impurity are formed in the N type single crystal silicon substrate 101 by a depth from the major surface 103 thereof up to about 0.3 μm. In a region beneath the gate electrode 125, that is, in a channel region between the source and drain regions 115 and 116, a P$^-$ type impurity region 105 containing boron in the order of $2 \times 10^{17}$/cm$^3$ is formed in a depth of about 0.1 μm down from an interface 103 between the gate oxide film 102 and the N type single crystal silicon substrate 101. Below this P type impurity region 105, an N type impurity region 106 containing phosphorus in the order of $2 \times 10^{17}$/cm$^3$ by a depth of about 0.3 μm from the bottom of the P type impurity region 105. The N type impurity region 106 for restriction of punch-through exists in a portion below the portion beneath the gate electrode. Since this does not contact with a bottom portion of the source and drain regions 115 and 116, PN junction capacitance can be reduced. Although, in this embodiment, it is provided directly on the N type single crystal silicon substrate, it is, of course, possible to provide an IGFET in an N type impurity layer such as well provided in a P type single crystal silicon substrate.

FIGS. 4A to 4D show fabrication steps according to a second embodiment of the present invention. In FIG. 4, the same components as those in FIG. 3 are indicated by the same reference numerals.

According to an IGFET of the second embodiment, a high impurity density region has a narrower width than a space between the source and drain regions.

Figure 4A:
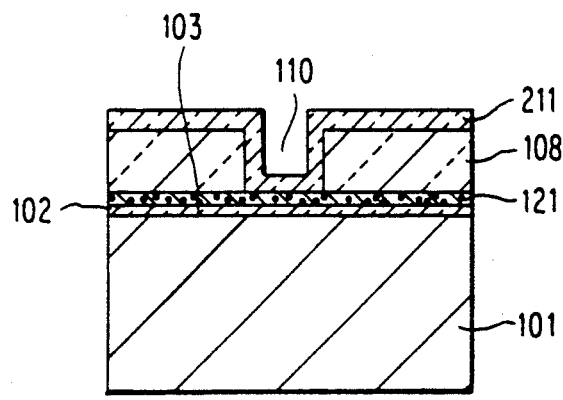
FIGS. 4A to 4D are cross-sectional views showing sequentially process steps in a second embodiment of the present invention.
Figure 4B:
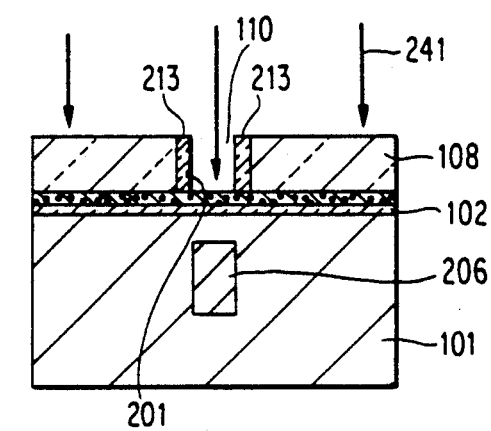
Figure 4C:
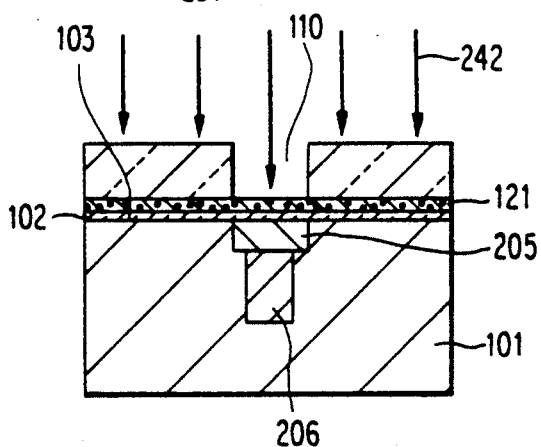
Figure 4D:
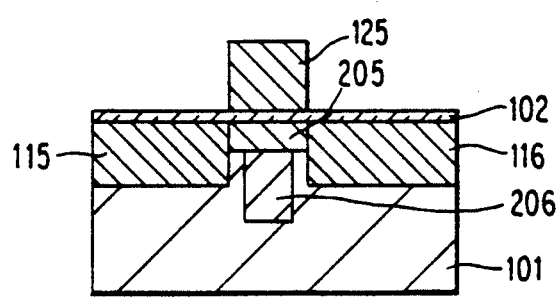

After the steps shown in FIGS., 3A, 3B and 3C, the photoresist film pattern 115 is removed, and a silicon nitride film 211 having thickness in the order of 0.2 μm is deposited by a CVD method (FIG. 4A). The silicon nitride film 211 is etched predominately in a direction perpendicular to the major surface 103 of the substrate 101 by means of a reactive anisotropic ion etching technique until an upper surface of the silicon oxide layer 108 is exposed, leaving side walls 213 of the silicon nitride film on the side faces 201 of the opening 110. Then, as in the first embodiment, an implantation of phosphorus ion 241 followed by an activation is performed to form an N type impurity region 206 inward the substrate 101 (FIG. 4B). After the side walls 213 of silicon nitride are removed by using hot phosphoric acid, ion implantation of boron 242 followed by an activation is performed as in the first embodiment to form a P type impurity region 205 between the major surface 103 and the N-type impurity region 206 (FIG. 4C). Thereafter, a gate electrode 125 is formed and a P type source and drain regions 115 and 116 are formed by using the gate electrode as a mask through similar steps to those shown in FIGS. 3E to 3H (FIG. 4D).

In the second embodiment, the N type high impurity density region 206 does not directly contact with the P type high impurity density source and drain regions 115 and 116. Therefore, it is possible to reduce PN junction capacitance formed at the sides of the source and drain regions, and further increase breakdown voltage thereof.

A third embodiment of the present invention will be described with reference to FIGS. 5A to 5I. In these figures, the same components as those in FIGS. 3 and 4 are indicated by the same reference numerals.

In the second embodiment shown in FIG. 4, the gate electrode is formed after the side walls 213 are removed. However, according to the present embodiment a gate electrode is formed while such side walls are left so that a gate electrode can be miniaturized beyond a machining limitation of photolithography, which is determined by photoresist nature and exposure device.

Figure 5E:
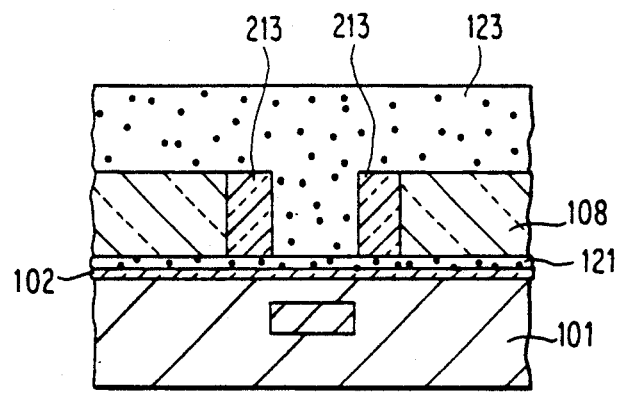
Figure 5F:
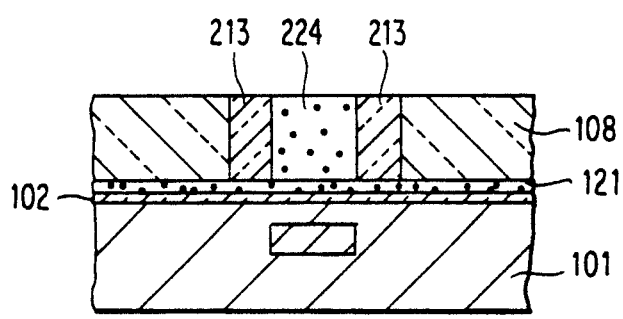
Figure 5G:
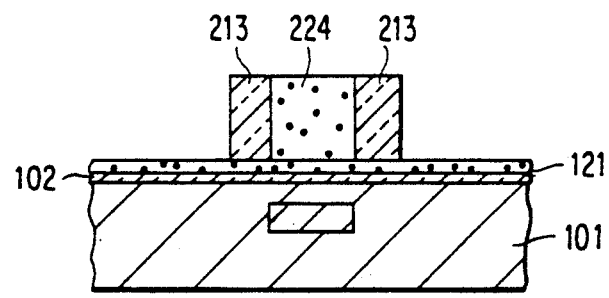
Figure 5H:
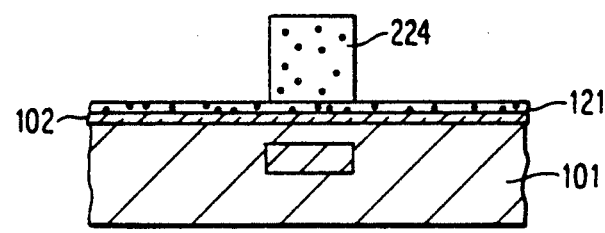
Figure 5I:
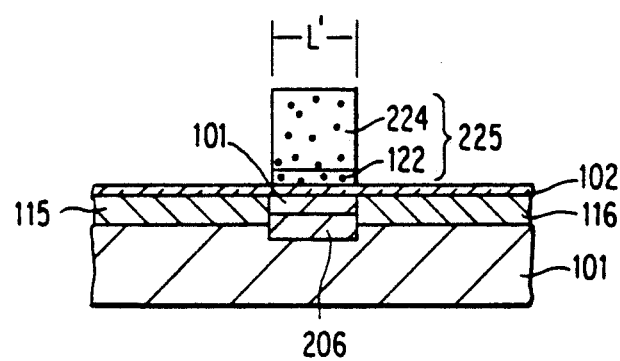

Process steps shown in FIGS. 5A and 5B are the same as in FIGS. 3A to 3C, and the process steps shown in FIGS. 5C and 5D are the same as in FIGS. 4A and 4B. Namely, the CVD silicon oxide layer 108 is used as a mask layer because the etching speed of silicon oxide can be larger than that of polysilicon under elected etching conditions, and the silicon nitride film 211 is used for forming the side walls 213 because the etching speed of silicon nitride can be larger than that of polysilicon and of silicon oxide under elected etching conditions of a reactive ion anisotropic etching. Owing to the side walls 213 from the silicon nitride film 211 having 0.2 μm thickness, the length of 1.0 μm of the opening 110 in the channel length direction (source-drain direction) is reduced from 1.0 μm by twice the thickness of the silicon nitride film 211, that is, to 0.6 μm. Then, ion implantation of phosphorus 241 is performed similarly to FIG. 4B to form a high impurity density N region 206. Thereafter, as shown in FIG. 5E, a second polysilicon film 123 is entirely formed without removing the side walls 213. Then, as shown in FIG. 5F, the second polysilicon film 123 is etched away by a reactive ion anisotropic etching method until the upper surface of the CVD silicon oxide layer 108 is exposed. As a result, a portion 224 of the second polysilicon film 123 which fills the opening portion is left. Then, as shown in FIG. 5G( the CVD silicon oxide layer 108 is removed by using diluted oxygen fluoride (HF) solution and then the side walls 213 of silicon nitride is removed by using suitably heated phosphoric acid, as shown in FIG. 5H. In these steps, the first polysilicon film 121 serves as a mask. Thereafter, the exposed parts of the first polysilicon film 121 are removed by a reactive anisotropic ion etching without using a mask as in other embodiments, resulting in a gate electrode 225 consisting of the upper portion 224 made of the thick second polysilicon film 123 and the lower portion 122 made of the thin first polysilicon film 121 and having a length L' of 0.6 μm. Next, ion implantation of P type impurity is performed to the substrate 101 using the gate electrode 225 as a mask to form N-type source and drain regions 115, 116 (FIG. 5I).

Figure 6A:
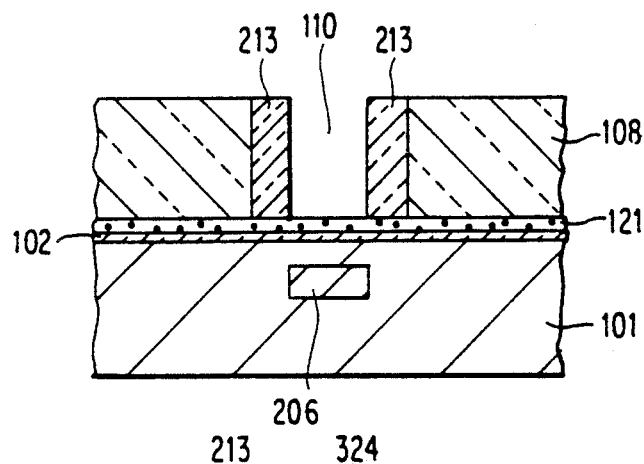
FIGS. 6A to 6C are cross-sectional views showing sequentially process steps in a fourth embodiment of the present invention.
Figure 6B:
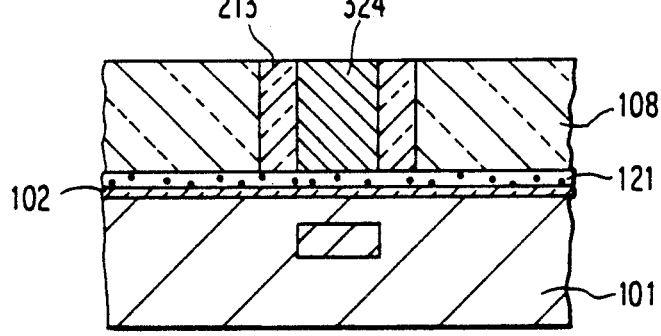
Figure 6C:
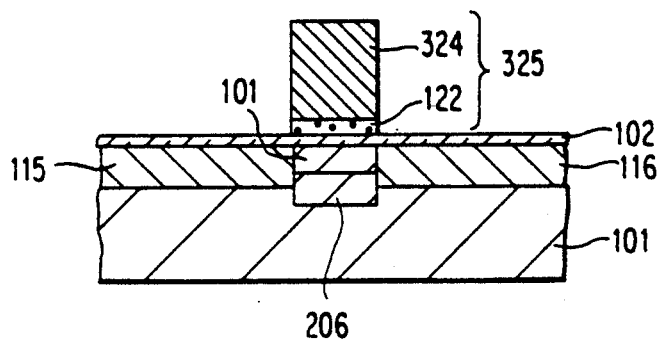

FIGS. 6A to 6C show a fourth embodiment of the present invention. In these figures, the same components as those in FIGS. 3 to 5 are indicated by the same reference numerals. Instead of the second polysilicon film in FIG. 5, tungsten which is a high melting point metal is used. That is, after the steps shown in FIG. 6A which corresponds to FIG. 5D, a tungsten film 324 is grown in an opening portion 110 by means of a tungsten growth technique (FIG. 6B). Then, similar steps to those shown in FIGS. 5G and 5H are performed to form a gate electrode 325 of the thick tungsten film 324 and the underlying portion 122 of the thin first polysilicon film 121 or the tungsten silicide film therebetween. Then by implanting P type impurity into the substrate by using the gate electrode 325 as a mask, a P type source region 115 and a P type drain region 116 are formed. In this embodiment, the gate electrode having micronized size is fabricated as in the case of the third embodiment. Further, this fabricating method is effectively applied to produce an IGFET operable at higher speed since electric resistance of tungsten forming the gate electrode is lower than that of polysilicon.

Although, in the respective embodiments described herein before, P channel IGFET's are disclosed each having an N type semiconductor substrate in which P type source and drain regions are formed, it is of course possible to apply the present invention to fabricate an N channel IGFET in which an N type source region and an N type drain region are formed in a P type semiconductor substrate. Further, although in the first and second embodiments, the impurity region 105 or 205 for threshold voltage control formed in the channel region is of an opposite conductivity type to that of the substrate, it is possible to make the conductivity type of the threshold voltage control region the same as that of the substrate while its net impurity density is lower than that of the substrate, by controlling an amount of impurity of the opposite conductivity type to be implanted to the substrate.

What is claimed is:

1. A method of manufacturing an insulated gate field effect transistor, comprising the steps of:
    forming a thin insulating film on a major surface of a semiconductor substrate of a first conductivity type to form a gate insulating film;
    forming a thin first polycrystalline silicon film on said insulating film;
    forming a mask layer on said first polycrystalline silicon film and forming an opening in said mask layer;
    ion-implanting said substrate with impurities of said first conductivity type through said insulating film using said mask layer as a mask to form a first impurity region of said first conductivity type and having a high impurity density in said substrate beneath said opening;
    forming continuously a conductive film within said opening so as to fill said opening and on an upper surface of said mask layer;
    removing said conductive film except a portion within said opening to expose an upper surface of said mask layer and to leave within said opening;
    removing said mask layer entirely;
    etching away selectively said first polycrystalline silicone film except a portion thereof beneath said conductive film pattern having configuration determined by said opening to form a gate electrode by said remaining portion of said first polycrystalline silicon film and said conductive film pattern;
    implanting impurities of a second conductivity type opposite to said first conductivity type in said semiconductor substrate using said gate electrode as a mask to form source and drain regions of said second conductivity type in said semiconductor substrate; and
    wherein said first impurity region is formed by said ion implantation of said first conductivity type with side walls being left on side faces of said opening of said mask layer.

2. The method as claimed in claim 1 further comprising the steps of removing said side walls after said first impurity region is formed and implanting impurity ions of said second conductivity type to said semiconductor substrate to form a second impurity region for controlling threshold voltage of said transistor in a channel region of said transistor between said first impurity region and said major surface of said semiconductor substrate.

3. A method of manufacturing an insulated gate field effect transistor, comprising the steps of:
    forming a thin insulating film on a major surface of a semiconductor substrate of a first conductivity type to form a gate insulating film;
    forming a thin first polycrystalline silicon film on said insulating film;
    forming a mask layer on said first polycrystalline silicon film and forming an opening in said mask layer;
    ion-implanting said substrate with impurities of said first conductivity type through said insulating film using said mask layer as a mask to form a first impurity region of said first conductivity type and having a high impurity density in said substrate beneath said opening;
    forming continuously a conductive film within said opening so as to fill said opening and on an upper surface of said mask layer;
    removing said conductive film except a portion within said opening to expose an upper surface of said mask layer and to leave within said opening;
    removing said mask layer entirely;
    etching away selectively said first polycrystalline silicon film except a portion thereof beneath said conductive film pattern having configuration determined by said opening to form a gate electrode by said remaining portion of said first polycrystalline silicon film and said conductive film pattern;
    implanting impurities of a second conductivity type opposite to said first conductivity type in said semiconductor substrate using said gate electrode as a mask to form source and drain regions of said second conductivity type in said semiconductor substrate; and
    wherein said opening is filled with said conductive film with side walls being formed on side faces of said opening of said mask layer and said etching of said first polycrystalline silicon film is performed after said mask layer and said side walls are removed.

4. The method as claimed in claim 3, wherein said conductive film is composed of a second polycrystalline silicon film.

5. The method as claimed in claim 3, wherein said conductive film is composed of a film of high melting point metal and/or a silicide film of a high melting point metal.

6. The method as claimed in claim 3, wherein said insulating film is composed of a thermal silicon oxide film, said mask layer is composed of a silicon oxide layer and said side walls are composed of a silicon nitride film.

* * * * *